United States Patent
Larson et al.

(10) Patent No.: US 8,547,669 B2
(45) Date of Patent: Oct. 1, 2013

(54) ARC FAULT MITIGATION FOR PHOTOVOLTAIC SYSTEMS

(75) Inventors: Brett E. Larson, Cedar Rapids, IA (US); Gary W. Scott, Mount Vernon, IA (US)

(73) Assignee: Schneider Electric USA, Inc., Palatine, IL (US)

( * ) Notice: Subject to any disclaimer, the term of this patent is extended or adjusted under 35 U.S.C. 154(b) by 367 days.

(21) Appl. No.: 13/004,962

(22) Filed: Jan. 12, 2011

(65) Prior Publication Data
US 2012/0174961 A1 Jul. 12, 2012

(51) Int. Cl.
*H02H 3/00* (2006.01)
*H02H 9/08* (2006.01)

(52) U.S. Cl.
USPC .......... 361/42; 361/2; 361/7; 361/49

(58) Field of Classification Search
USPC .......... 361/42, 4, 2, 7, 49
See application file for complete search history.

(56) References Cited

U.S. PATENT DOCUMENTS

| | | | |
|---|---|---|---|
| 4,186,330 A | 1/1980 | Böhringer | |
| 4,728,878 A * | 3/1988 | Anthony | 322/2 R |
| 5,289,998 A * | 3/1994 | Bingley et al. | 244/172.7 |
| 5,742,367 A | 4/1998 | Kozaki | |
| 5,963,406 A * | 10/1999 | Neiger et al. | 361/42 |
| 6,101,073 A | 8/2000 | Takehara | |
| 7,030,769 B2 * | 4/2006 | Miller | 340/635 |
| 7,375,871 B2 | 5/2008 | Libretto et al. | |
| 7,463,460 B2 * | 12/2008 | Haines | 361/2 |
| 7,602,080 B1 | 10/2009 | Hadar et al. | |
| 7,748,137 B2 * | 7/2010 | Wang | 34/396 |
| 2002/0183944 A1 | 12/2002 | Dollar, II | |
| 2004/0211456 A1 | 10/2004 | Brown et al. | |
| 2006/0162772 A1 | 7/2006 | Presher, Jr. et al. | |
| 2006/0237058 A1 | 10/2006 | McClintock et al. | |
| 2008/0278003 A1 * | 11/2008 | Pouchet et al. | 307/66 |
| 2009/0132302 A1 | 5/2009 | Beekhuis | |
| 2010/0072823 A1 | 3/2010 | Oliver | 307/81 |

FOREIGN PATENT DOCUMENTS

WO WO 2005/071512 8/2005

OTHER PUBLICATIONS

International Search Report, International Application No. PCT/US2012/020161, date of mailing Apr. 18, 2012, 3 pages.

(Continued)

*Primary Examiner* — Rexford Barnie
*Assistant Examiner* — Zeev V Kitov
(74) *Attorney, Agent, or Firm* — Nixon Peabody LLP (57) ABSTRACT

Systems, methods, and devices are presented for mitigating arc fault events in a photovoltaic system. An aspect of this disclosure is directed to a photovoltaic system for generating electrical power. The photovoltaic system includes one or more solar panels, and one or more shuttering assemblies, each of which is configured to selectively limit the quantity of light received by one or more of the solar panels. One or more sensing devices detect characteristics of an arc fault event in the photovoltaic system, and output signals indicative thereof. A control module is operatively connected to the shuttering assemblies and the sensing devices. The control module is configured to direct the one or more shuttering assemblies to reduce the quantity of light received by at least one of the one or more solar panels in response to the output signals indicating there is an arc fault event in the photovoltaic system.

20 Claims, 6 Drawing Sheets

(56) References Cited

OTHER PUBLICATIONS

Written Opinion of The International Searching Authority, International Application No. PCT/US2012/020161, date of mailing Apr. 18, 2012, 7 pages.
Knier, G.; "How Do Photovoltaics Work?"; http://science.nasa.gov/science-news/science-at-nasa/2002/solarcells; Nov. 23, 2010.
Fat Spaniel Technologies; String Monitoring for Solar Electric Systems: Detect Faults, Maximize Output; dated 2007 (2 pages).
RECtrack DC Monitoring Combiner Box brochure; Energy Recommence Inc.; dated 2008 (2 pages).
Ramsey et al.; U.S. Appl. No. 12/857,778, filed Aug. 17, 2010 (26 pages).

\* cited by examiner

ARC FAULT MITIGATION FOR PHOTOVOLTAIC SYSTEMS

FIELD OF THE INVENTION

The present disclosure relates generally to photovoltaic systems, and more particularly to systems, methods, and devices for mitigating arc faults in photovoltaic systems.

BACKGROUND

Photovoltaics is the field of science related to generating electrical power by converting light energy into electrical current using conductors that exhibit the photovoltaic (PV) effect. In most PV applications, the light energy is radiation from sunlight and, for this reason, PV devices are typically referred to as solar cells. Photovoltaic power generation normally employs one or more solar panels, each of which comprises a number of solar cells. Each solar cell includes a photoemissive material that exhibits a property known as the photoelectric effect, wherein which the material absorbs photons of light and, once exposed to electromagnetic radiation above a certain threshold frequency, reactively emits or ejects electrons. The resultant flow of electrons generates an electric current, which can be used as electrical power. Some materials presently employed by PV cells include monocrystalline silicon, polycrystalline silicon, amorphous silicon, cadmium telluride, and copper indium selenide/sulfide.

A solar PV array typically comprises an arrangement of strings of electrically-connected PV panels. A string in the context of PV arrays can be an arrangement of PV panels connected together in series. A PV array is generally composed of multiple strings of PV panels. Each string output can be received in a device known as a combiner, which "combines" the current from each string into a larger conductor, called a feeder. The feeder feeds downstream equipment (e.g., the direction of current flow away from the PV panel(s)), such as disconnect switches, possibly other lower-level combiners, and ultimately to an inverter. The inverter can be a DC-to-AC inverter that converts the DC currents produced by each string of the PV array into a corresponding AC current. The combiner can receive strings from one or more PV arrays.

A practical arc fault detection system is typically designed to distinguish between normal arcing and destructive arcing. Normal arcing may occur between surfaces designed to control arcing, such as switching contacts, motor commutators, and fuse elements. Destructive arcing generally occurs through failed insulating material or through air between surfaces not intended to control arcing. When the wattage becomes sufficiently large, for example 600 Vac per pole and 600 Vdc through two pole (300 Vdc/Pole) across an electrical switch, the electron flow across switch contacts can be sufficient to ionize the air molecules between the contacts as the switch is opened or closed, forming a normal electric arc. There are various conditions that may cause a destructive arc fault, such as insufficient contact pressure, electrical stress from repeated overloading, corroded, worn, or aged wiring or insulation, etc. Electrical arcing can occur at various locations in the photovoltaic system, for example, in the solar cell panels, distribution wiring, disconnect panels, inverter, and/or branch circuit wiring. Different types of arcing that may occur include series (e.g., arcing across a broken conductive path), parallel (e.g., arcing through damaged insulation), and faults to ground (e.g., arcing to grounded components).

The electric arc is very hot and may damage insulation, wiring, and other components in the PV system. Current solutions being pursued for mitigating arc faults in PV systems include opening of the circuit at the combiner box or turning off the inverter if an arcing fault is detected on the system. This method can be effective for series faults within the system, but is generally not effective for parallel faults between circuit conductors or the circuit conductors to ground. In these scenarios, opening the circuit could potentially increase the energy in the arc path, which can aggravate the situation. Methods of shorting the output of solar panels have also been attempted, but may induce additional stresses on series arcing fault hazards. There is therefore a need for more effective and efficient arc fault mitigation in photovoltaic installations.

SUMMARY

Systems, methods, and devices are disclosed for mitigating arc faults in photovoltaic systems. In some aspects of the present disclosure, the system essentially "turns off" the power generation of the solar panel, which removes energy from the arcing event in the solar instillation. For example, an exemplary configuration combines PV shuttering with arc fault detection electronics and firmware to provide more effective and efficient arc fault mitigation in a photovoltaic system. The types of arcing that can be detected includes series, parallel, and faults to ground anywhere in the electrical distribution system. An advantage of some of the disclosed features include reducing damage and fires resulting from arcing faults. Additional benefits include the ability to put the system in a safe state for system maintenance, and for emergency personnel responding to a fire on the premises where the system is installed. Moreover, shuttering allows maintenance on the solar array and wiring with reduced danger of shock. Mechanical shuttering and roller shuttering can also be deployed for additional protection from hail and other potentially detrimental weather conditions. Additionally, end mechanical shutters on the top, bottom, or sides of the PV panel can have a reflective exposed surface and, when open, can be positioned at an angle to increase the solar radiation incident on the panel. For instance, if the shutter is flat, the end shutter can be held outward at approximately 135 degrees from the surface of the plane of the cells to reflect additional light onto the array.

According to some aspects of the present disclosure, a photovoltaic (PV) system for generating electrical power is presented. The PV system includes one or more solar panels, each of which includes at least one photovoltaic cell, and one or more shutter assemblies, each of which is configured to selectively limit the quantity of light received by at least one of the solar panels. One or more sensing devices detect characteristics of an arc fault event in the PV system, and output signals indicative thereof. A control module is operatively connected to the shutter assemblies and the sensing devices. The control module is configured to direct the one or more shutter assemblies to reduce the quantity of light received by at least one of the solar panels in response to the output signals indicating there is an arc fault event in the PV system.

According to other aspects of the present disclosure, a method of mitigating an arc fault events in a photovoltaic system is featured. The photovoltaic system includes one or more solar panels, each having at least one photovoltaic cell. The method includes: monitoring system characteristics, including a voltage or a current, or both, at one or more locations within the photovoltaic system; determining if an arc fault event occurred within the photovoltaic system by applying arc detection algorithm rules to the monitored system characteristics; and, in response to determining there is an arc fault event within the photovoltaic system, reducing the quantity of light received by at least one of the one or more solar panels.

According to other aspects of the present disclosure, a method of mitigating arc fault events in a photovoltaic (PV) system is presented. The PV system includes a plurality of solar panels, each of which includes one or more photovoltaic cells. The PV system also includes a combiner box that selectively electrically connects the solar panels to an inverter. The method includes: continuously monitoring system characteristics, including a voltage and a current associated with the PV system, at multiple locations within the PV system; detecting PV panel electrical characteristics; detecting inverter characteristics; detecting network impedance characteristics; determining if an arc fault event occurred within the photovoltaic system by applying arc detection algorithm rules to the monitored system characteristics, the detected PV panel electrical characteristics, the detected inverter characteristics, and the detected network impedance characteristics; and in response to determining there is an arc fault event within the photovoltaic system, substantially eliminating the transmission of light to the plurality of solar panels, turning off the inverter, or electrically disconnecting the plurality of solar panels from the inverter via the combiner box, or any combination thereof.

The above summary is not intended to represent each embodiment or every aspect of the present disclosure. Rather, the foregoing summary merely provides an exemplification of some of the novel features included herein. The above features and advantages, and other features and advantages of the present disclosure, will be readily apparent from the following detailed description of the embodiments and best modes for carrying out the present invention when taken in connection with the accompanying drawings and appended claims.

While the present disclosure is susceptible to various modifications and alternative forms, specific embodiments have been shown by way of example in the drawings and will be described in detail herein. It should be understood, however, that the disclosure is not intended to be limited to the particular forms disclosed. Rather, the disclosure is to cover all modifications, equivalents, and alternatives falling within the spirit and scope of the invention as defined by the appended claims.

DETAILED DESCRIPTION

Figure 1:
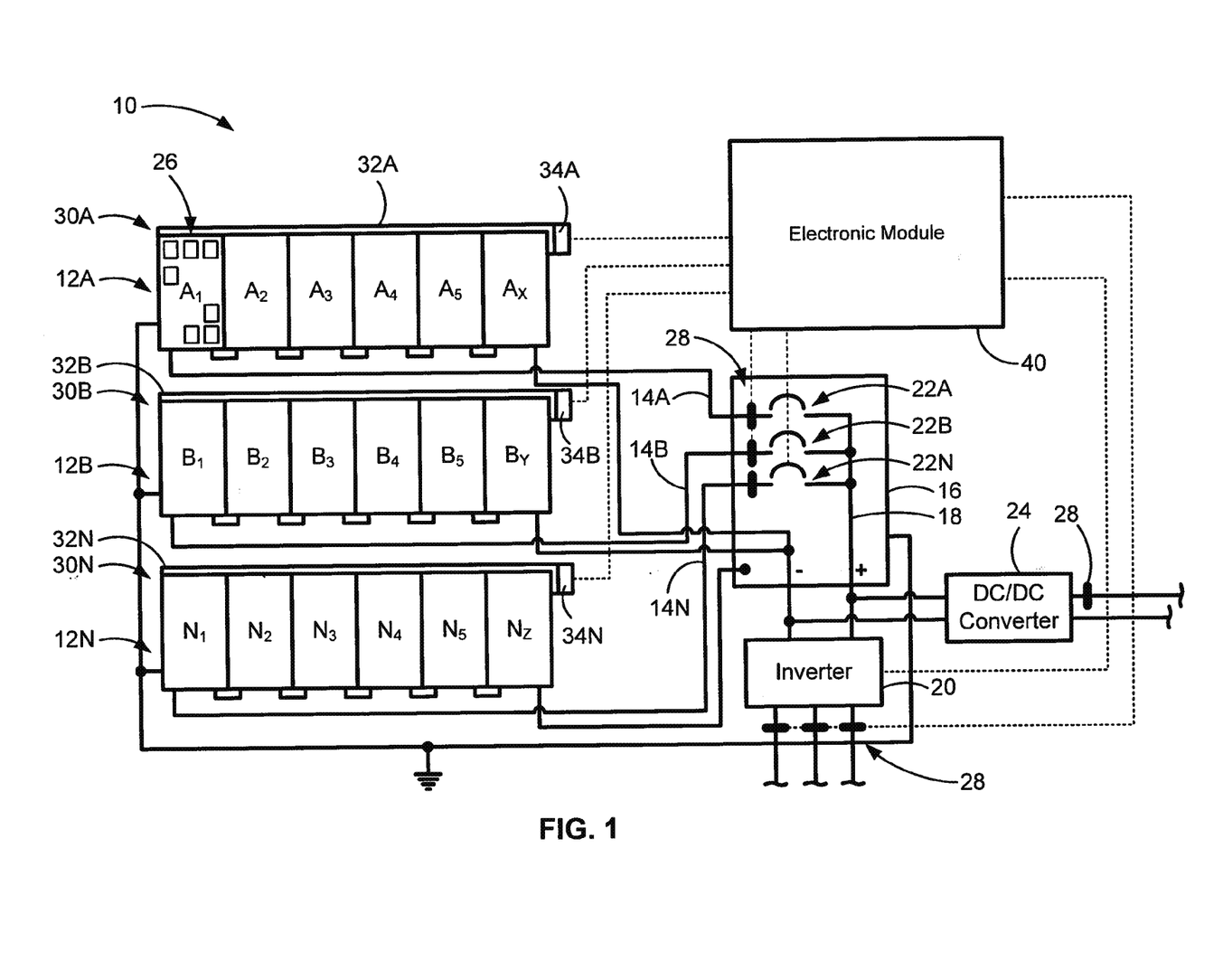
FIG. 1 is a schematic diagram of an exemplary photovoltaic system with PV shuttering and arc fault detection electronics in accordance with aspects of the present disclosure.

Referring now to the drawings, wherein like reference numerals refer to like components throughout the several views, FIG. 1 illustrates an exemplary photovoltaic system or apparatus assembly, designated generally as 10, in accordance with aspects of the present disclosure. The photovoltaic (PV) system 10 includes one or more strings, such as first 12A, second 12B, and Nth 12N strings, of series-connected PV panels, respectively designated $A_1$-$A_X$, $B_1$-$B_Y$, $N_1$-$N_Z$. Each string 12A, 12B, . . . 12N is connected to a corresponding panel feed 14A, 14B, . . . 14N in a first-level combiner box 16. The number of series-connected PV panels X in the first string 12A can be the same as or different from the number of series-connected PV panels Y and Z in the second and Nth strings 12B, 12N. Each PV panel conventionally includes an array of PV cells, schematically illustrated for reference purposes at 26 in panel A1, which convert solar or other light energy into a corresponding current, which can be stored, for example, in a battery or other storage device and/or used to power DC or AC electrical loads.

The combiner box 16 receives individual feeds of DC current from the strings of PV panels, and aggregates or "combines" each of those DC currents onto a single conductor 18, typically called a feeder. The conductor 18 transmits a DC current composed of each of the individual DC currents from each of the strings, for example, to a DC-to-AC inverter 20, a DC/DC converter 24, or to a downstream combiner (not shown), which can combine DC current outputs from other first-level combiners that receive DC current directly from strings of PV panels. PV panels and combiners can be arranged in a hierarchical structure, with sets of panels feeding into first-level combiners and groups of first-level combiners feeding into downstream combiner(s), which ultimately feed into a DC-to-AC inverter, such as the inverter 20 shown in FIG. 1. Collectively, the strings of PV panels 12A, 12B, . . . 12N make up a PV array, and the combiner 16 can receive strings from a single PV array, as seen in FIG. 1, or multiple PV arrays. The combiner box 16 can be provided with an enclosure, such as a metal housing, that houses therein and protects components of the combiner box 16, such as against physical intrusion and environmental pollution.

Structurally, the panel feeds 14A, 14B, . . . 14N can correspond to electrical conductors, and functionally, the panel feeds 14A, 14B, . . . 14N can carry DC current from each corresponding string 12A, 12B, . . . 12N. Basically, the panel feeds 14A, 14B, . . . 14N communicate DC current to the combiner 16, which in turn merges the individual DC currents into a combined DC current for output to the DC-to-AC inverter 20 or the DC/DC converter 24. The combiner 16 may comprise different combinations of protection devices, resistive elements, and optional protection diodes in the path of the panel feed. Each panel feed 14A, 14B, . . . 14N can be similarly configured, can each take on a different configuration, or any combination therebetween.

A typical configuration may include the voltage being tapped across a fuse element in the panel feed, but several other configurations can also be implemented. By way of non-limiting example, the panel feed 14A is connected to the first panel string 12A, which has a number, X, of series-connected PV panels A, as described above. In this exemplary arrangement, an optional blocking diode (not shown) can be connected in series to the first panel feed 14A. The blocking diode protects the panels $A_1$-$A_X$ (and the other electrically coupled panels $B_1$-$B_Y$ and $N_1$-$N_Z$) in the PV system 10 by allowing DC current to flow from the PV panels $A_1$-$A_X$ into the first panel feed 14A, but blocking reverse current from flowing back into the PV panels $A_1$-$A_X$. A respective switch 22A, 22B . . . 22N, such as a relay switch or circuit breaker, is connected between the PV panels $A_1$ . . . $A_X$, $B_1$ . . . $B_Y$, $N_1$ . . . $N_Z$ and the inverter 20. Each electrical switch 22A, 22B and 22C selectively disconnects a respective one of the PV panel strings 12A, 12B . . . 12N from the inverter 20. A fuse or other optional protection device can be connected in series to each panel feed 14A, 14B, . . . 14N to prevent, for example, overcurrents in the conductors. Other arrangements are likewise applicable without departing from the scope and spirit of the present disclosure.

With continuing reference to FIG. 1, the combiner 16 includes a positive terminal + and a negative terminal −, which are connected to the inverter 20 and converter 24 or, in alternative configurations, to a downstream combiner and/or an electrical load. The negative terminal − is connected to the strings of PV panels 12A, 12B, . . . 12N, and the positive terminal + is connected to the switches 22A, 22B . . . 22N for receiving the composite DC current when the switches 22A, 22B . . . 22N are closed. The combiner 16 can further include other electrical components, such as a communications module, an optional interface, an optional alarm module, and an optional local display, any or all of which may be housed resident within the combiner box 16 or located distal from the combiner box 16.

Each of the PV panel strings 12A, 12B, . . . 12N of FIG. 1 has a respective shutter assembly, respectively designated 30A, 30B . . . 30N. In alternative arrangements, only selected ones of the PV panel strings 12A, 12B, . . . 12N or individual ones of the PV panels $A_1$-$A_X$, $B_1$-$B_Y$, $N_1$-$N_Z$ are provided with a shuttering assembly. The shutter assemblies 30A, 30B . . . 30N are designed to selectively limit the quantity of light received by at least one of the one or more PV panels $A_1$-$A_X$, $B_1$-$B_Y$, $N_1$-$N_Z$. It may be desirable, in some applications, for the shutter assemblies 30A, 30B . . . 30N, whether individually or collectively, to selectively limit or eliminate the quantity of light received by all of the PV panels $A_1$-$A_X$, $B_1$-$B_Y$, $N_1$-$N_Z$. For instance, the first shutter assembly 30A includes light-limiting structure 32A that is activated by a shutter actuator 34A. Likewise, the second shutter assembly 30B includes light-limiting structure 32B that is activated by a shutter actuator 34B, whereas the Nth shutter assembly 30N includes light-limiting structure 32N that is activated by a shutter actuator 34N. As described hereinbelow, the light-shutter actuators 34A, 34B . . . 34N are controlled by a control module 40, which can be an electronic control module (ECU), to selectively reduce or otherwise eliminate the amount of light received by a corresponding PV panel string 12A, 12B, . . . 12N. Various representative shuttering assemblies can be integrated into the PV system 10 of FIG. 1, some of which are illustrated in FIGS. 2A-5B. In an optional arrangement, for example, the amount of received light is selectively reduced or eliminated by angling or rotating all of the PV panel strings 12A, 12B, . . . 12N, selected ones of the strings 12A, 12B, . . . 12N, or individual ones of the PV panels $A_1$-$A_X$, $B_1$-$B_Y$, $N_1$-$N_Z$ away from the light source.

Figure 2A:
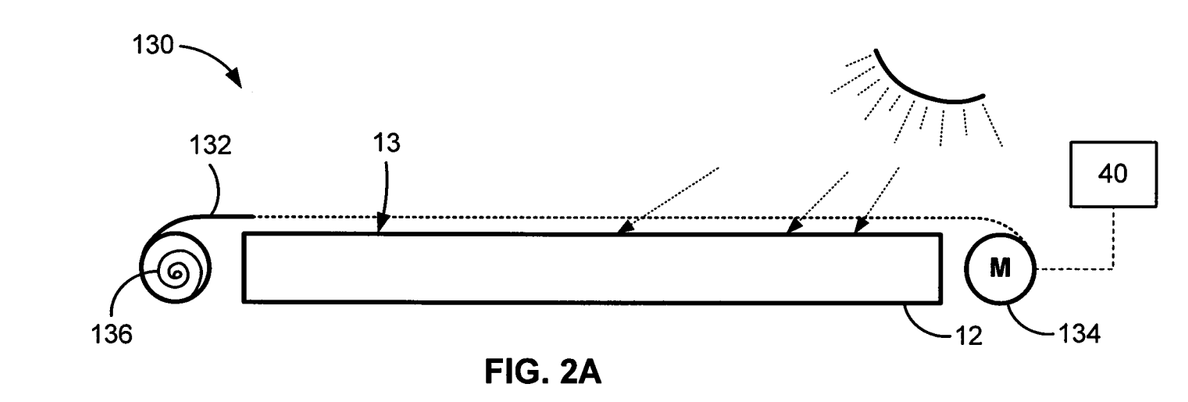
FIGS. 2A and 2B are schematic illustrations of an exemplary PV shuttering assembly in accordance with aspects of the present disclosure.
Figure 2B:
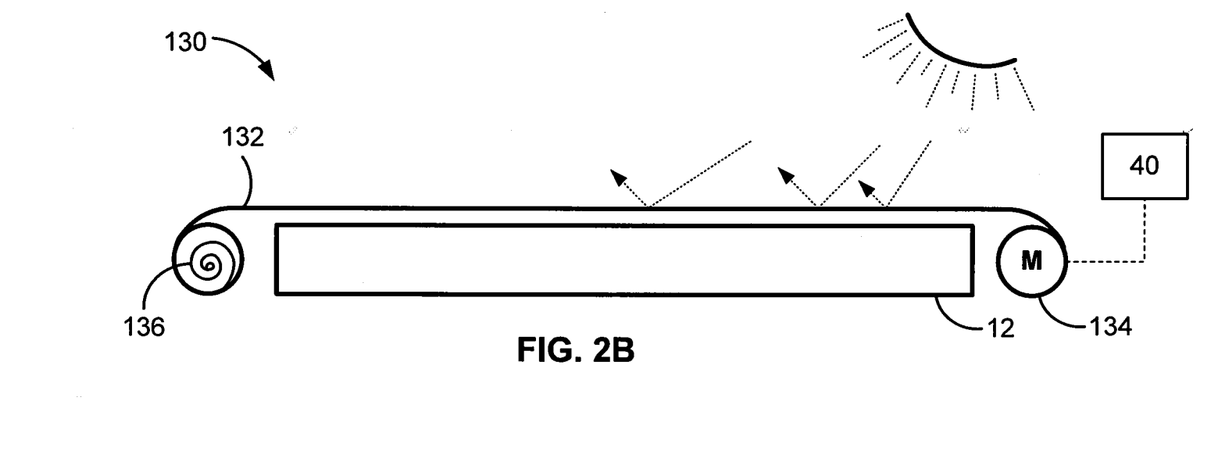

FIGS. 2A and 2B are schematic illustrations of an exemplary PV shuttering assembly 130. The shuttering assembly 130 includes an elongated, opaque sheet 132 that is shown in FIG. 2A biased, e.g., via coil spring 136, into a wound or stowed position. When in the stowed position (also referred to herein as the "first position"), the elongated sheet is displaced from and, thus, substantially uncovers a light-receiving surface 13 of the string 12 of solar panels. The sheet 132 is movable, for example, via motor 134, from the stowed position to an unwound or blocking position, as seen in FIG. 2B. When in the blocking position (also referred to herein as the "second position"), the elongated sheet 132 extends across and substantially covers the light-receiving surface 13 of the string 12 of solar panels. This shuttering method minimizes or otherwise removes the power source (i.e., the sunlight), which is effective for mitigating both series and parallel faults, including faults to ground. In an alternative configuration, the sheet 132 could be spring biased into the blocking position (FIG. 2B), and selectively moved to the stowed position (FIG. 2A) via motor 134. To that end, the sheet 132 could be selectively moved to any position between the stowed and blocking positions, for example, to limit only a predetermined portion of the light source.

Figure 3A:
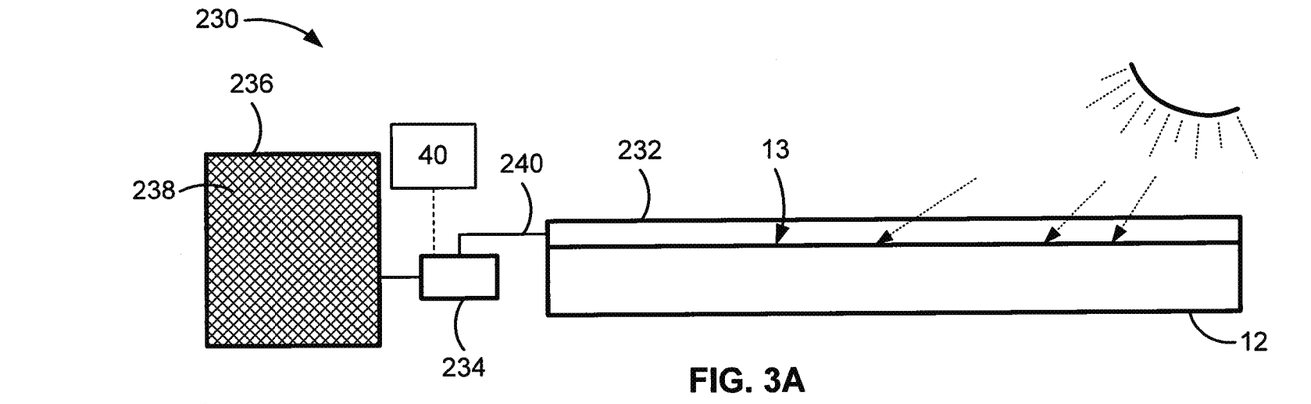
FIGS. 3A and 3B are schematic illustrations of another exemplary PV shuttering assembly in accordance with aspects of the present disclosure.
Figure 3B:
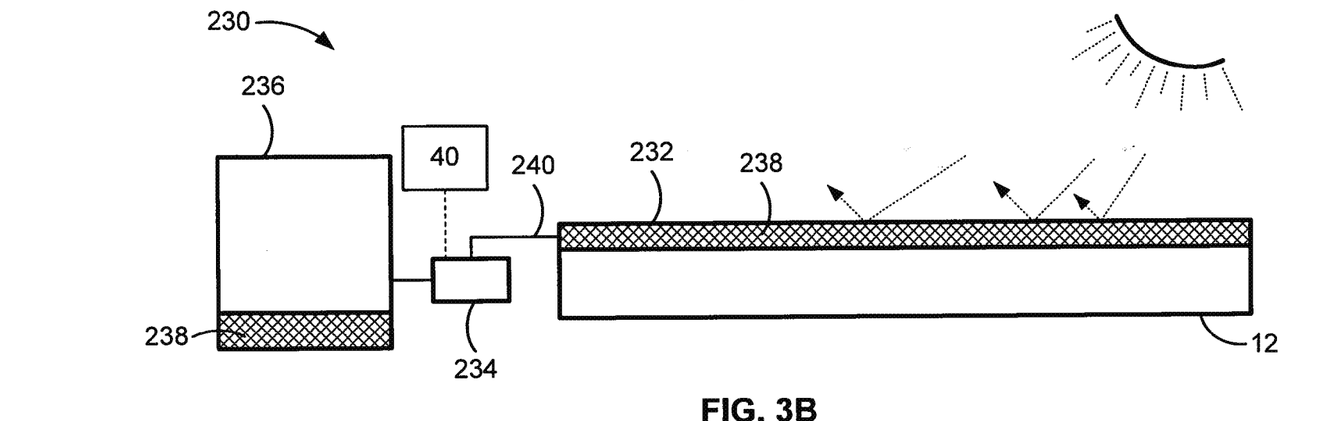

FIGS. 3A and 3B are schematic illustrations of another exemplary PV shuttering assembly 230. The shuttering assembly 230 includes a transparent or substantially transparent fluid container 232, which covers all or at least a portion of the light-receiving surface 13 of the solar panel string 12. A reservoir 236, which stores an opaque or substantially opaque fluid 238, is fluidly coupled to the container 232 via a fluid conduit 240, which may be in the form of a fluid pipeline or hydraulic control unit, for example. The fluid conduit 240 allows the fluid 238 to be transferred back-and-forth between the reservoir 236 and the container 232. In the exemplary configuration of FIGS. 3A and 3B, a motorized hydraulic pump 234, which is operatively controlled by the control module 40, pumps fluid to and/or from the fluid reservoir 236. By way of illustration, and not limitation, FIG. 3A shows the container 232 drained of any fluid 238 such that light is readily transmitted therethrough to the light-receiving surface 13 of the PV panel string 12. Fluid may be drained from the container 232 by gravity, the hydraulic pump 234, or any other known method. The hydraulic pump 234 can be activated to force fluid 238 through the fluid conduit 240 into the container 232, as seen in FIG. 3B. The fluid 238 acts to limit or completely block the transmission of light to the PV panel string 12. The amount of fluid transferred into the container 232 can be varied, for example, to limit only a predetermined portion of the light source. Similar to the construction illustrated in FIGS. 2A and 2B, the shuttering system 230 of FIGS. 3A and 3B can be controlled to minimize or remove the power source (i.e., the sunlight), which is effective for mitigating both series and parallel faults, including faults to ground.

Figure 4A:
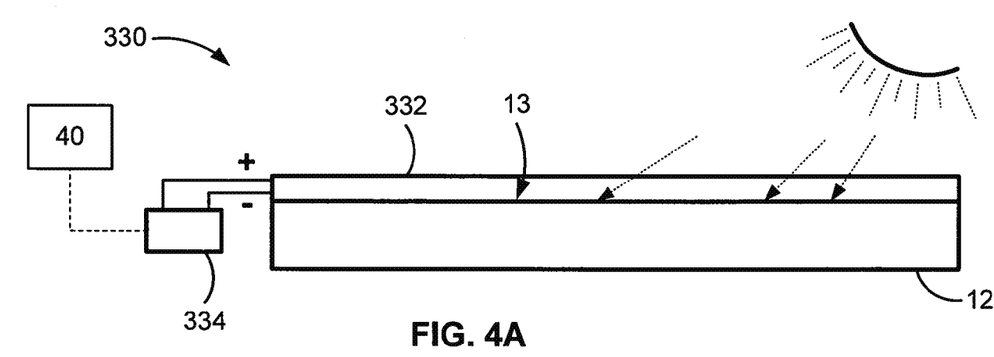
FIGS. 4A and 4B are schematic illustrations of yet another exemplary PV shuttering assembly in accordance with aspects of the present disclosure.
Figure 4B:
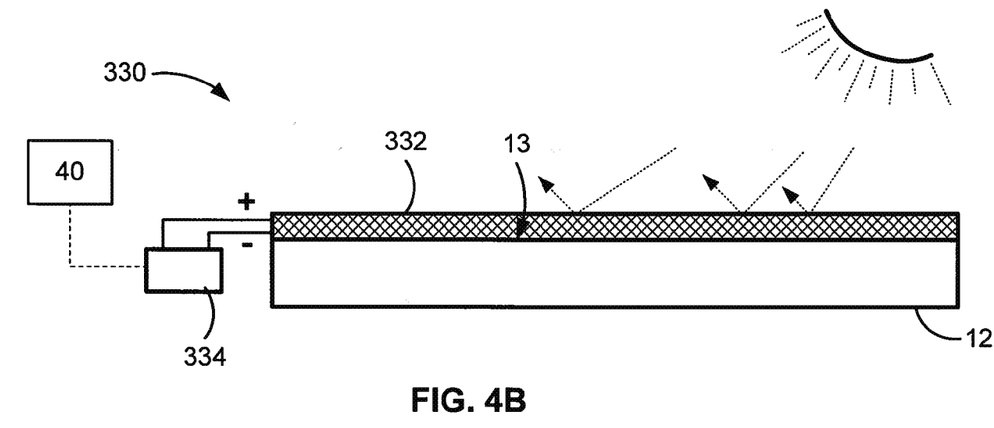

FIGS. 4A and 4B are schematic illustrations of another exemplary PV shuttering assembly 330. The PV shuttering assembly 330 includes a light-blocking panel 332 that covers all or at least a portion of the light-receiving surface 13 of the solar panel string 12. The panel 332 has a variable opacity that can be modified with the application of a catalyst, such as a voltage or a current. In one non-limiting example, the light-blocking panel 332 is an electrically switchable glass panel (also known as "smart glass" or "EGlass"), which covers the light-receiving surface 13 of the solar panel string 12. Electrically switchable glass changes light transmission properties in response to the application of an electric voltage/current, and thus allows for control of the amount of light and heat that passes therethrough. One such smart-glass assembly and a device for controlling the same is set forth in U.S. Pat. No. 7,375,871 B2, to John Libretto et al., which is entitled "Electrochromic Glass Control Device" and is incorporated herein by reference in its entirety. In another optional configuration, the light-blocking panel 332 is a liquid crystal display (LCD) panel, which may be in the form of a thin-film transistor (TFT) or a super-twisted nematic (STN) dot-matrix type liquid-crystal panel, that covers the light-receiving surface 13 of the solar panel string 12. Application of an electric current to the LCD panel acts to rearrange the pixels therein, thereby allowing for selective control (e.g., increase or decease) of the opacity of the LCD panel. One such LCD panel is disclosed, for example, in U.S. Pat. No. 5,289,998, to John D. Bingley et al., which is entitled "Solar Array Output Regulator using Variable Light Transmission" and is incorporated herein by reference in its entirety.

Figure 5A:
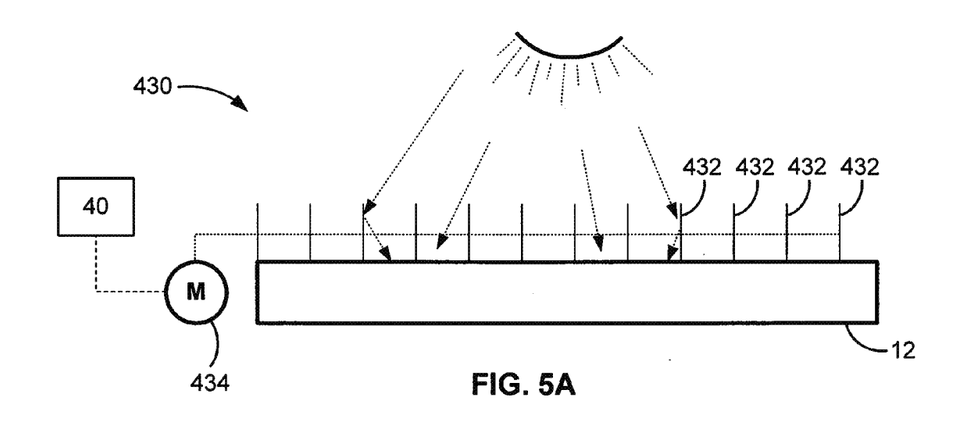
FIGS. 5A and 5B are schematic illustrations of yet another exemplary PV shuttering assembly in accordance with aspects of the present disclosure.
Figure 5B:
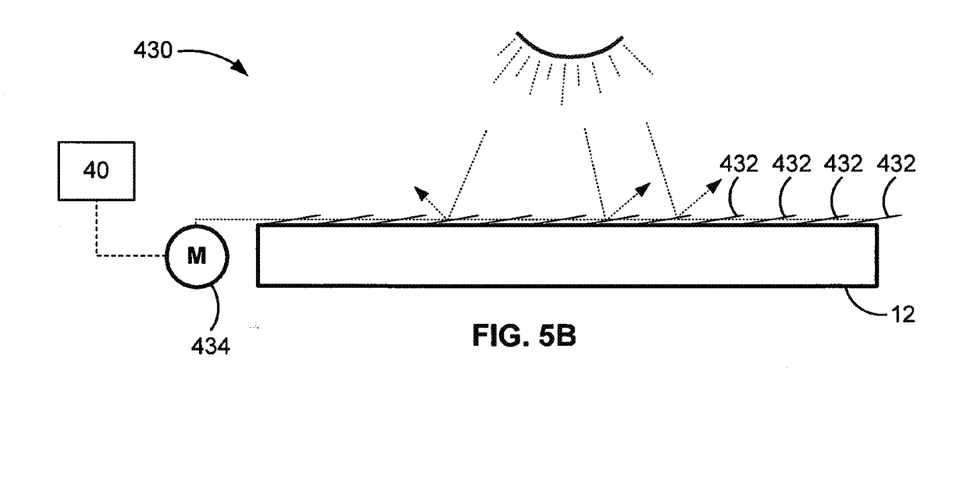

FIGS. 5A and 5B are schematic illustrations of another exemplary PV shutter assembly 430. The shutter assembly 430 includes one or more slats 432 that are shown in FIG. 5A arranged in an exposing or uncovering orientation. When in the uncovering orientation (also referred to herein as the "first orientation"), the slats 432 are situated so as to substantially uncover the light-receiving surface 13 of the solar panel string 12. In addition, each of the slats 432 can be provided with a reflective surface such that, when the shutter assembly 430 is in the exposing orientation, the slats 432 can be positioned at an angle to increase the solar radiation incident on the panel. The slats 432 are pivotable or otherwise movable, e.g., via motor 434, between the uncovering orientation, shown for example in FIG. 5A, to a covering orientation, shown for example in FIG. 5B. When in the covering orientation (also referred to herein as the "a second orientation"), the slats 432 substantially cover the light-receiving surface 13 of the solar panel string 12. In so doing, the slats 432 reflect light, which removes the power source and is therefore effective for mitigating both series and parallel faults, including faults to ground.

The PV system 10, according to aspects of the present disclosure, is continuously monitored for characteristics of arcing faults via sensors and electronic circuits installed throughout the system. Referring back to FIG. 1, for example, the photovoltaic system 10 includes one or more sensing devices 28, which may be current sensors, voltage sensors, and arc fault circuit interrupters (AFCI), each of which is operable to detect characteristics of an arc fault event in the photovoltaic system and output a corresponding signal indicative thereof. For instance, an arc fault even can be detected by direct current (DC) signature analysis and pattern matching against known arc fault characteristics. Other known methods can also be employed. A variety of sensing devices and methods for detecting arc fault events in an electrical circuit are disclosed, for example, in U.S. Pat. No. 5,682,101, to Stanley J. Brooks et al., which is entitled "Arcing Fault Detection System," U.S. Pat. No. 5,986,860, to Gary W. Scott, which is entitled "Zone Arc Fault Detection," U.S. Pat. No. 6,259,996, to Andy A. Haun et al., which is entitled "Arc Fault Detection System," and U.S. Pat. No. 7,151,656, to Robert F. Dvorak et al., which is entitled "Arc Fault Circuit Interrupter System," and all of which are incorporated herein by reference in their respective entireties.

The sensing devices 28 can be dispersed throughout the PV system 10 to measure and/or monitor arc fault characteristics at various locations. For example, voltage and/or current measurements can be taken between each individual solar array and a respective DC/DC converter. If there is an electrical switch or breaker between the solar array and the DC/DC converter, a circuit voltage can be measured downstream from the switch. To that end, voltage and current measurements can be taken downstream from the DC/DC converter, for example, between the DC/DC converter and a DC/AC inverter. In configurations where there are multiple DC/DC converters (e.g., one for each solar array), voltage and/or current measurements can be taken downstream from where the DC output of the solar arrays are combined, for example, upstream from the DC/AC inverter. Similarly, voltage and/or current measurements can be taken upstream from the combiner box, as seen in FIG. 1. As a final example, voltage and/or current measurements can be taken downstream from the DC/AC inverter. Of course, not all of the foregoing points would have to be monitored. Depending, for example, on the system design, these measurement locations can change. But, in general, sensing devices can be located before or after active components (e.g., inverters, converters, switches, breakers, etc.) within the system. For instance, the voltage and current can be monitored on one side of each circuit breaker disconnect point, such as at switches 22. In some configurations, there is a DC breaker for the output of each string of PV modules, a DC breaker disconnect before the DC-DC converter, if applicable, a DC breaker before the DC-to-AC inverter, and an AC breaker after the inverter. Each of these breakers can be tripped if the voltage and current signals indicate an arc.

The control module 40 can include various features, including, but not limited to, a voltage monitor, current monitor, arc fault algorithms, which are described in further detail below, a shutter control feature, a trip circuit, arc fault signal conditioning, an emergency stop, which is also described in further detail below, a test circuit, a power supply, a memory, and a processor. The voltage monitor is operable to monitor voltage and determine abnormal voltage levels and fluctuating voltages that indicate arcing. The current monitor is operable to monitor current and determine abnormal current levels and fluctuating currents that indicate arcing. Fluctuations are expected and considered generally normal for the system, for example, due to normal inverter operation, clouds, shadows, etc. The arc fault detection algorithms are designed to distinguish between normal fluctuations and arcing induced fluctuations. Responsive to an arc detection signal or emergency stop, the shutter control feature can be engaged or otherwise triggered to activate the shutter system, which blocks or limits light from entering the PV array. Also, in response to an arc detection signal, the trip circuit can send a signal to the appropriate circuit breaker(s), shutter control module, and/or inverter(s) to electrically isolate the faulted section of the PV system to prevent damage due to electrical arcing and prevent backfeeding from other electrical sources. For fault signal conditioning, amplifiers and filters condition the sensor signals to a range where arcs are found. Practical arcing detection is generally believed to be below 100 kHz and peak arcing current is expected to be below twice the maximum PV current. System electrical capacitance and inductance will interact with the arcing signal to produce unique arcing signatures which will change from PV system to PV system. This system can take into account system impedance as part of the detection scheme. A test circuit, which can include test sensors, shutter actuators, and other components, can be incorporated into the PV system for proper function. This test can be either automatically done on a periodic bases or done at the request of the system operator.

The control module 40 is operatively connected to the shutter assemblies 30A, 30B . . . 30N and the various sensing devices 28. The control module 40 manipulates the assorted components within the PV system 10 to mitigate the occurrence of an arc fault event. One response may be for the control module 40 to direct one or more of the shutter assemblies 30A, 30B . . . 30N to reduce or eliminate the amount of light received by a respective string 12A, 12B . . . 12N of solar panels. That is, when a fault condition is detected in the PV system 10, the control module 40 sends a signal to the actuators 34A, 34B . . . 34N controlling the light-limiting structure 32A, 32B . . . 32N to block or otherwise prevent sunlight from reaching the solar cells 26. Once closed, the shutter assemblies 30A, 30B . . . 30N remove the energy supplied to the PV system 10, which in turn extinguishes the arcing fault. The system PV 10 can also selectively operate to close only the shutters assembly or assemblies 30A, 30B . . . 30N for the PV string 12A, 12B . . . 12N where a fault is occurring. In this way, the whole system need not be shut down when an arc fault event occurs.

Other responses to the detection of an arc fault event in the PV system 10 include the control module 40 opening one or more of the breakers (e.g., electrical switch 22A, 22B and 22C of FIG. 1) to selectively disconnect one or more of the PV strings 12A, 12B . . . 12N from the inverter. Additionally, the system 10 can turn off the inverter 20 in response to output signals from the sensing devices 28 indicating there is an arc fault event in the PV system 10. It should be understood that the system can take action comprising any combination of the foregoing responses to mitigate the occurrence of an arc fault event. The control module 40 can also inform the user of the arc fault event and provide a location of the arc fault event. Moreover, the control module 40 can determine if the arc fault event occurred within a particular one or ones of the solar panels, and responsively activate the shutter assemblies for only those solar panels.

A manual override feature can be provided to open all of the electrical switches in the combiner box, close all of the shutter assemblies, and turn off the inverter can also be provided. For example, the system can allow for a manual emergency stop button that would close all shutters (i.e., activate all light blocking mechanisms), open all circuit breakers, and turn off the inverter, thereby putting the installation in an electrically safe state. This is important for fire fighters who are presently exposed to electrical shock hazards when fighting fires on a building with solar installations.

Some advantages of the disclosed features include completely removing the available energy from the protected circuits, which would be effective not only for mitigating series arc faults but also parallel arc faults and faults to ground. In contrast, other proposed solutions leave at least part of the PV system energized, which can still have arcing paths and dangerous voltages. Some of the disclosed features thus ensure that the whole system is moved into an "electrically safe" state. Moreover, these aspects reduce the amount of damage done to the system and surrounding property and, in systems with a manual override feature, allows the operator to put the system in an electrically safe state by closing the shutter, opening the circuit breakers, and turning off the inverter.

Figure 6:
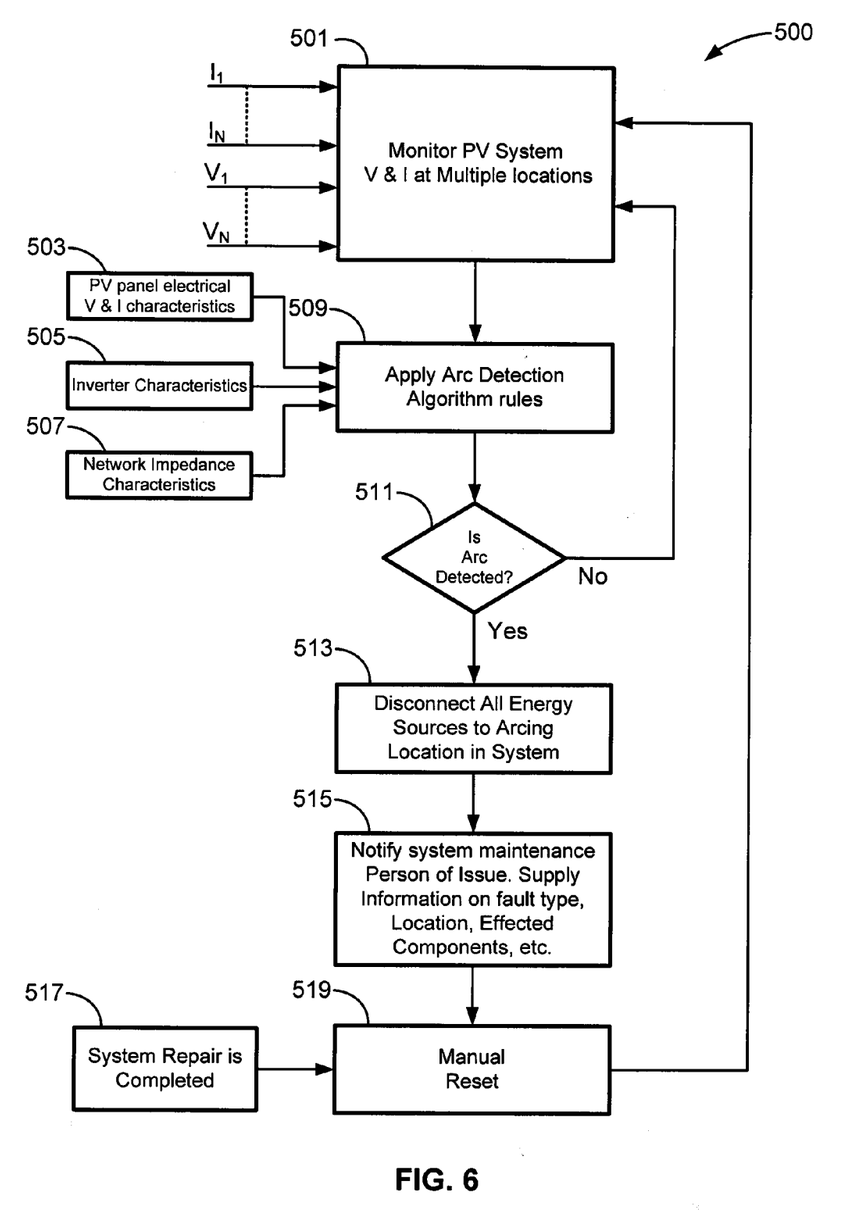
FIG. 6 is a flowchart for an algorithm that corresponds to instructions executed by a controller in accord with at least some aspects of the present disclosure.

FIG. 6 represents an algorithm that corresponds to at least some instructions that can be executed, for example, by the control module 40 to perform any or all of the above or below described functions and features associated with the disclosed concepts. The method or algorithm 500 of FIG. 6 is described herein with respect to the structure illustrated in FIGS. 1 and 2A-5B. However, the claimed methods of the present disclosure are not limited to the structure illustrated herein unless explicitly indicated otherwise in the claims.

At block 501, the method includes monitoring system characteristics, including a voltage and a current associated with the PV system, at one or more locations within the PV system. The voltage and current can be monitored continuously, intermittently, or otherwise, at any or all of the locations described above. Blocks 503, 505 and 507 respectively indicate that PV panel electrical characteristics, inverter characteristics, and network impedance characteristics are detected and input to the Arc Detection Algorithm indicated at block 509. Some PV panel electrical characteristics that can be input to the Arc Detection Algorithm include the operating voltage of one or more strings, the maximum operating current of one or more strings, the expected maximum rate of change of the voltage and current in one or more strings due to passing clouds or other obstructions, and/or the capacitance of the string(s) being protected. Some inverter characteristics that can be input to the Arc Detection Algorithm include current and voltage, switching frequency, expected harmonic distortion, changes in voltage and frequency as a result of max power algorithm, and equivalent inductance and capacitance of the input and output stages of the inverter. Network impedance characteristics that can be input to the Arc Detection Algorithm include wire/bus impedance that could attenuate the arcing signal trying to be measured. Impedance of the network includes inductance, resistance, capacitance of the module string and wiring up to the first DC conversion device (inverter or DC-DC converter).

At block 509, it is determined if an arc fault event occurred within the photovoltaic system. In one non-limiting example, determining if an arc fault event occurred includes applying arc detection algorithm rules to the monitored system characteristics, the detected PV panel electrical characteristics, the detected inverter characteristics, or the detected network impedance characteristics, or any combination thereof. In general, the algorithms look for operating parameters within the system that are not deemed "normal" and have the characteristics of arcing. Although not always required, such an approach makes the detection more accurate and eliminates false positives by knowing the operating parameters of the panel strings, inverters, and converters. It may also help to eliminate false positives by knowing the system impedances and the attenuation of the signal being measured. The following are some of the parameters that could be monitored and evaluated within the algorithm: (1) voltage and voltage fluctuations within the system as compared to expected values; (2) current and current fluctuations within the system as compared to expected values; (3) differential currents within the system to detect faults to ground; and (4) high frequency components of the current compared to expected values.

In response to determining there is an arc fault event within the photovoltaic system, block 513 includes disconnecting all energy sources to the arcing location within the system. This can include substantially eliminating the transmission of light to a corresponding one or ones of the solar panels. Block 513 can also include turning off the inverter, electrically disconnecting the solar panels from the inverter via the combiner box (e.g., open breakers in the combiner box), open the main DC breaker, open the main AC breaker, or open the branch breakers in the AC system or a combination of any of the above depending on the detected issue.

At block 515, an end user or other supervising entity is notified of the issue. Some of the information that can be supplied is the fault type, the fault location, the components affected by the fault, etc. At block 517, system repair is completed, and at block 519 the system is manually reset.

In some embodiments, the method 500 includes at least those steps enumerated above. It is also within the scope and spirit of the present disclosure to omit steps, include additional steps, and/or modify the order presented in FIG. 6.

While particular embodiments and applications of the present disclosure have been illustrated and described, it is to be understood that the present disclosure is not limited to the precise construction and compositions disclosed herein and that various modifications, changes, and variations can be apparent from the foregoing descriptions without departing from the spirit and scope of the invention as defined in the appended claims.

What is claimed is:

1. A photovoltaic system for generating electrical power, the photovoltaic system comprising:
   one or more solar panels each including at least one photovoltaic cell;
   one or more shuttering assemblies each configured to selectively limit a quantity of light received by at least one of the one or more solar panels;
   one or more inverters or converters, or both, electrically connected to the one or more solar panels;
   one or more sensing devices each operable to detect characteristics of an arc fault event in the photovoltaic system and output a signal indicative thereof; and
   one or more control modules operatively connected to the one or more shuttering assemblies, the one or more inverters or converters, and the one or more sensing devices; the one or more control modules being configured, in response to the output signals indicating there is an arc fault event, to direct the one or more shuttering assemblies to reduce the quantity of light received by at least one of the one or more solar panels and to turn off the one or more inverters or converters or to electrically disconnect the one or more inverters or converters from the one or more solar panels, or both.

2. The photovoltaic system of claim 1, wherein the one or more inverters or converters include an inverter, the system further comprising:
   a combiner box electrically connecting the one or more solar panels to the inverter, the combiner box including one or more electrical switches each configured to selectively disconnect at least one of the one or more solar panels from the inverter,
   wherein the control module is further configured to direct the one or more shuttering assemblies to reduce the quantity of light received by at least one of the one or more solar panels, or to direct at least one of the one or more electrical switches to selectively disconnect at least one of the one or more solar panels from the inverter, or both, in response to the output signals indicating there is an arc fault event.

3. The photovoltaic system of claim 2, further comprising a manual override feature configured to selectively open all of the electrical switches in the combiner box, close all of the shuttering assemblies, and turn off the inverter.

4. The photovoltaic system of claim 1, wherein the one or more inverters or converters include an inverter electrically connected to the one or more solar panels, and wherein the control module is configured to turn off the inverter and direct the one or more shuttering assemblies to reduce the quantity of light received by at least one of the one or more solar panels in response to the output signals indicating there is an arc fault event.

5. The photovoltaic system of claim 1, wherein the one or more solar panels includes a plurality of solar panels, and wherein the control module is further configured to determine if the arc fault event occurred relative to one or ones of the plurality of solar panels and responsively direct the one or more shuttering assemblies to only reduce the quantity of light received by the determined one or ones of the plurality of solar panels.

6. The photovoltaic system of claim 1, wherein the control module is further configured to communicate an indication informing a user of the arc fault event and an indication providing a location of the arc fault event.

7. The photovoltaic system of claim 1, wherein the one or more shuttering assemblies each includes an elongated opaque sheet movable between a first position, whereat the elongated sheet substantially uncovers a light-receiving surface of the at least one of the one or more solar panels, and a second position, whereat the elongated sheet substantially covers the light-receiving surface of the at least one of the one or more solar panels.

8. The photovoltaic system of claim 1, wherein the one or more shuttering assemblies each includes:
   a substantially transparent container covering at least a portion of a light-receiving surface of the at least one of the one or more solar panels;
   a reservoir holding a substantially opaque fluid; and
   a fluid conduit fluidly coupling the reservoir to the container such that the substantially opaque fluid is transferrable between the reservoir and the container.

9. The photovoltaic system of claim 1, wherein the one or more shuttering assemblies each includes an electrically switchable glass panel covering at least a portion of a light-receiving surface of the at least one of the one or more solar panels, the electrically switchable glass panel having a variable opacity changeable with the application of a voltage to the electrically switchable glass panel.

10. The photovoltaic system of claim 1, wherein the one or more shuttering assemblies each includes a liquid crystal display (LCD) panel covering at least a portion of a light-receiving surface of the at least one of the one or more solar panels, the LCD panel having a variable opacity changeable with the application of an electric field to the LCD panel.

11. The photovoltaic system of claim 1, wherein each of the one or more shuttering assemblies includes one or more slats operable to pivot between a first orientation, whereat the slats substantially uncover a light-receiving surface of the at least one of the one or more solar panels, and a second orientation, whereat the slats substantially cover the light-receiving surface of the at least one of the one or more solar panels.

12. A method of mitigating an arc fault event in a photovoltaic system with one or more solar panels and one or more inverters or converters, or both, electrically connected to the one or more solar panels; each of the solar panels including at least one photovoltaic cell, the method comprising:
   monitoring system characteristics, including a voltage or a current, or both, at one or more locations within the photovoltaic system;
   determining if an arc fault event occurred within the photovoltaic system by applying arc detection algorithm rules to the monitored system characteristics; and
   in response to determining there is an arc fault event within the photovoltaic system, reducing the quantity of light received by at least one of the one or more solar panels and turning off the one or more inverters or converters or electrically disconnecting the one or more inverters or converters from the one or more solar panels, or both.

13. The method of claim 12, further comprising, in response to determining that an arc fault event occurred within the photovoltaic system, informing a user the arc fault event occurred, a type of the arc fault event, a location of the arc fault event within the photovoltaic system, or system components affected by the arc fault event, or any combination thereof.

14. The method of claim 12, wherein the reducing the quantity of light includes positioning an elongated sheet across the at least one of the one or more solar panels so as to cover at least a portion of a light-receiving surface thereof.

15. The method of claim 12, wherein the reducing the quantity of light includes transferring a substantially opaque fluid from a reservoir through a fluid conduit to a substantially transparent container covering at least a portion of a light-receiving face of the at least one of the one or more solar panels.

16. The method of claim 12, wherein the reducing the quantity of light includes increasing an opacity of an electrically switchable glass panel covering at least a portion of a light-receiving face of the at least one of the one or more solar panels.

17. The method of claim 12, wherein the reducing the quantity of light includes increasing an opacity of a liquid crystal display (LCD) panel covering at least a portion of a light-receiving face of the at least one of the one or more solar panels.

18. The method of claim 12, wherein the reducing the quantity of light includes positioning one or more slats across the at least one of the one or more solar panels so as to substantially cover at least a portion of a light-receiving surface thereof.

19. The method of claim 12, wherein the photovoltaic system includes a combiner box electrically connecting the one or more solar panels to the one or more inverters or converters, the combiner box including one or more electrical switches each configured to selectively disconnect at least one of the one or more solar panels from the one or more inverters or converters, wherein the method includes, in response to determining there is an arc fault event within the photovoltaic system, reducing the quantity of light received by the solar panels, opening all of the electrical switches in the combiner box, or turning off the one or more inverters or converters, or any combination thereof.

20. A method of mitigating arc fault events in a photovoltaic (PV) system, the PV system including a plurality of solar panels each including at least one photovoltaic cell, and a combiner box selectively electrically connecting the plurality of solar panels to an inverter, the method comprising:
 continuously monitoring system characteristics, including a voltage and a current associated with the PV system, at multiple locations within the PV system;
 detecting PV panel electrical characteristics;
 detecting inverter characteristics;
 detecting network impedance characteristics;
 determining if an arc fault event occurred within the photovoltaic system by applying arc detection algorithm rules to the monitored system characteristics, the detected PV panel electrical characteristics, the detected inverter characteristics, and the detected network impedance characteristics; and
 in response to determining there is an arc fault event within the photovoltaic system, substantially eliminating the light received by the plurality of solar panels, turning off the inverter, or electrically disconnecting the plurality of solar panels from the inverter via the combiner box, or any combination thereof.

* * * * *